United States Patent
Huang

(10) Patent No.: US 7,466,031 B2
(45) Date of Patent: Dec. 16, 2008

(54) STRUCTURE AND METHOD OF FORMING METAL BUFFERING LAYER

(75) Inventor: Tai-Yuan Huang, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 264 days.

(21) Appl. No.: 11/134,578

(22) Filed: May 20, 2005

(65) Prior Publication Data

US 2005/0266667 A1 Dec. 1, 2005

(30) Foreign Application Priority Data

May 26, 2004 (TW) .............................. 93114942 A

(51) Int. Cl.
*H01L 29/40* (2006.01)
(52) U.S. Cl. ................ 257/781; 257/786; 257/E23.146
(58) Field of Classification Search ................ 438/926; 257/781, 786, E23.146
See application file for complete search history.

(56) References Cited

U.S. PATENT DOCUMENTS

| | | | |
|---|---|---|---|
| 2003/0067077 A1* | 4/2003 | Lee | 257/758 |
| 2004/0040855 A1* | 3/2004 | Batinovich | 205/123 |
| 2004/0115925 A1* | 6/2004 | Tseng et al. | 438/633 |
| 2004/0222478 A1* | 11/2004 | Zhang et al. | 257/422 |
| 2005/0085062 A1* | 4/2005 | Kim | 438/614 |
| 2005/0104208 A1* | 5/2005 | Bartelo et al. | 257/737 |

* cited by examiner

*Primary Examiner*—Asok K Sarkar
(74) *Attorney, Agent, or Firm*—Stout, Uxa, Buyan & Mullins, LLP

(57) ABSTRACT

A structure and method of forming a metal buffering layer during the formation of a redistribution layer is provided. It only changes a mask to form the metal buffering layer and circuit traces simultaneously. The metal buffering layer can increase the flatness of the dielectric layer covering on the metal buffering layer. It can also make the structure under the metal buffering layers suffer uniform pressure to prevent the passivation layer from cracking and the circuit traces from collapsing in order to increase the yield of the packaged chips.

13 Claims, 4 Drawing Sheets

STRUCTURE AND METHOD OF FORMING METAL BUFFERING LAYER

BACKGROUND OF THE INVENTION

1. Field of the Invention

The present invention relates to a structure and method of forming a buffering layer, and more particularly to a structure and method of forming a metal buffering layer in a manufacture process of a conductive bump.

2. Description of the Prior Art

Conventionally, the I/O bonding pads are distributed on the surroundings of chips of a wafer, as the original design concerned or for easily printing wires. In order to redistribute the distribution of the I/O bonding pads, a rerouting (or redistribution) technology of the manufacture process of a conductive bump is used for changing the surrounding arrangement into the dispersing arrangement of the bonding pads to achieve the demand of miniaturizing a package size. Referring to FIG. 1, a wafer 110, thereon, has at least a bonding pad 120 and a passivation layer 130 exposing a portion of the bonding pad 120. A dielectric layer 140 covers the passivation layer 130 and exposes the exposed portion of the bonding pad 120, and can be made of a certain material, such as Benzocyclobutene (BCB). Subsequently, forming a metal layer as a redistribution layer (RDL) on the dielectric layer 140, then, etching the redistribution layer to form a demanded circuit trace 150. Another dielectric layer 160 is formed on the exterior layer and a portion of the circuit trace 150 is exposed. Finally, an under bump metallurgy layer (not shown) and the conductive bump 170 are formed in turn on the exposed portion of the circuit trace 150 to change the distribution of the I/Os.

The above-mentioned packaging structure often incurs a collapsing problem of the circuit trace 150, and that reduces the reliability of the packaged wafer. In addition, due to the circuit trace 150 being bulged on the dielectric layer 140, the surface covered by the dielectric layer 160 is not perfectly flat, and furthermore the flatness of the exterior surface of the dielectric layer 160 is also influenced. Therefore, it is necessary to provide a new method and structure to overcome the disadvantages of the conventional packaging structure and increase the reliability of the packaged wafer.

SUMMARY OF THE INVENTION

In order to solve the above-mentioned problems, a structure and method of forming a metal buffering layer is provided to reduce the collapsing probability of the circuit trace, and then increase the reliability of the packaged wafer.

It is an objective of the present invention to provide a structure and method of forming a redistribution layer, which can reduce a collapsing problem of a circuit trace and increase the flatness of an exterior surface, by forming a circuit trace in the redistribution layer simultaneously with forming a metal buffering layer.

In one embodiment of the present invention, the provided manufacture process reserves the originally known packaging process and only needs to make a change on a photo-mask therein, for forming a desired metal buffering layer to achieve the above objections. A structure and method of forming a metal buffering layer in the manufacture process of a redistribution layer is described below, wherein, first, a wafer having at least a bonding pad thereon is provided. A passivation layer is formed on the wafer and a portion of the bonding pad is exposed. Then, forming a dielectric layer on the passivation layer and exposing the previously exposed portion of the bonding pad. After a metal layer is formed on the dielectric layer and the exposed portion of the bonding pad, a portion of the metal layer is removed for separating the metal layer into two portions isolated with each other: a first portion and a second portion, wherein the first portion is electrically connected to the exposed portion of the bonding pad. Then, another dielectric layer is formed on the metal layer, and a portion of the first portion is exposed for forming a conductive bump thereon later.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art front this detailed description.

BRIEF DESCRIPTION OF THE DRAWINGS

The present invention will become more fully understood from the following detailed description and the accompanying drawings, which are given by way of illustration only, and thus are not limitative of the present invention, and wherein.

DESCRIPTION OF THE PREFERRED EMBODIMENT

It is necessary to notice that the manufacture processes and the structures described below do not include the complete ones. The present invention can be implemented with any kinds of manufacturing technologies, and only the necessary ones promoting to understand are described in the following.

The invention will be explained in detail in accordance with the accompanying drawings, it would be known that all drawings below are only in simplified forms and not drawn in proportion to the real cases, further, the dimensions of the drawings are enlarged for explaining and understanding more clearly.

Figure 1:
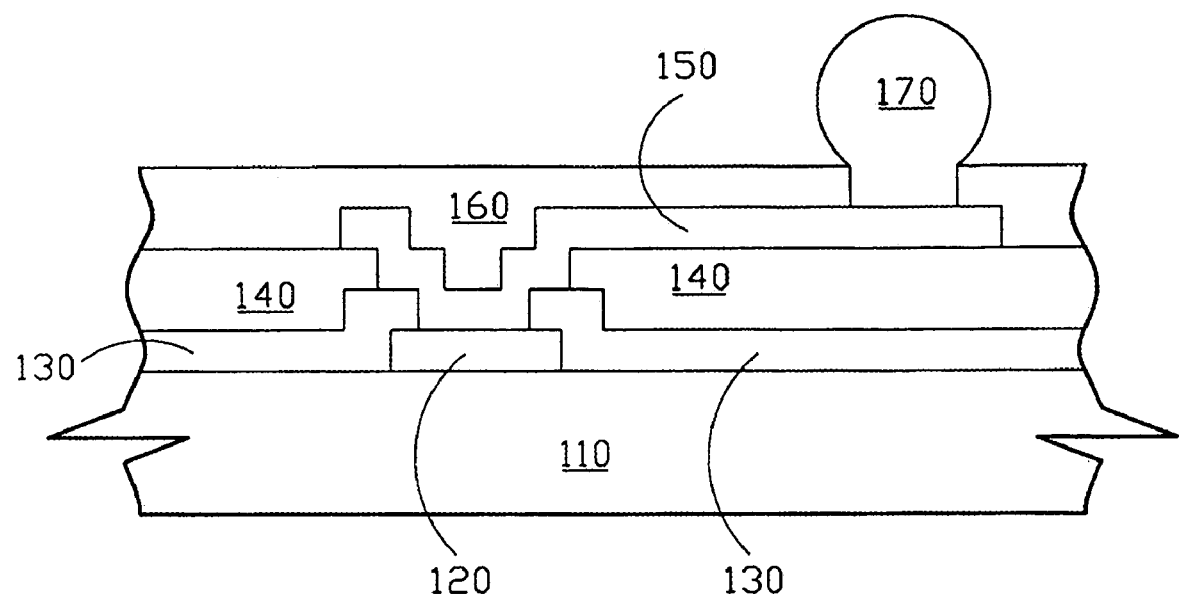
FIG. 1 is a schematic cross-sectional view of a general manufacturing method of a redistribution layer.
Figure 2:
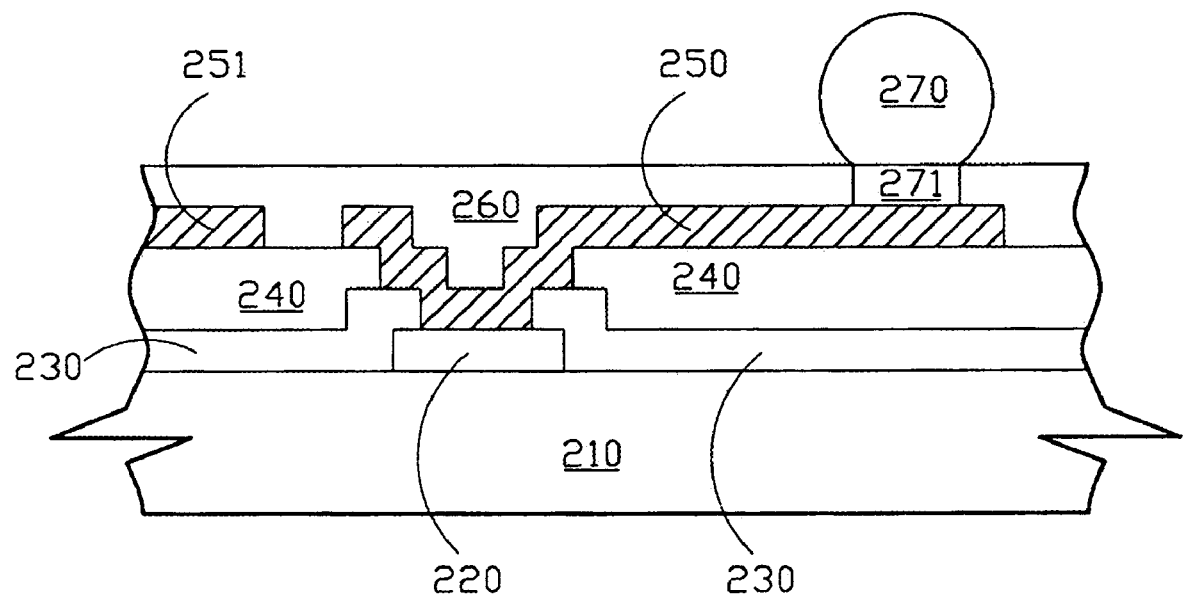
FIG. 2 is a schematic cross-sectional view of one preferred embodiment of the present invention.

Referring to FIG. 2, it shows a schematic cross-sectional view of one preferred embodiment of the present invention. A wafer 210 having at least a bonding pad 220 and a passivation layer 230 exposing a portion surface of a bonding pad 220 thereon is provided. In the embodiment, the bonding pad 220, for example, can be an aluminum or copper pad, and the passivation layer 230 can be made of a dielectric material, such as a silicon-nitride layer, and be used to protect the wafer 210 and provide a planar surface for the wafer 210. Subsequently, a dielectric layer 240 is formed on a passivation layer 230, wherein the dielectric layer 240 also exposes a partial surface of the bonding pad 220 exposed by the passivation layer 230. In this embodiment, the dielectric layer 240 can be made of a material, such as BCB (Benzocyclobutence), and be used for stress buffering.

Additionally, a metal layer is formed on the dielectric layer 240 as a redistribution layer which comprises two portions isolated with each other a circuit trace 250 and a metal buffering layer 251. In the embodiment, the circuit trace 250 is not electrically connected to the metal buffering layer 251, and a portion of the dielectric layer 240 is exposed between the two separated portions. Besides, the metal buffering layer 250 is preferably made of a full-piece metal layer. Furthermore, the circuit trace 250 is electrically connected to the bonding pad 220 since the circuit trace 250 is in touch with the surface of the bonding pad 220 exposed by the dielectric layer 240 and the passivation layer 230. Following, another dielectric layer 260 is formed on the circuit trace 250, the metal buffering layer 251 and the exposed portion of the dielectric layer 240.

The dielectric layer 260 made of a certain material, such as BCB, exposes a portion of the circuit trace 250, namely, the dielectric layer 260 having an opening to expose a portion of the circuit trace 250. Wherein, the position of the opening of the dielectric layer 260 is in an offset relationship with respect to the position of the bonding pad 220, that is to say, the exposed portion of the circuit trace 250 is offset from overlapping relationship with the position of the bonding pad 220. In other words, the opening of the dielectric layer 260 does not completely overlap the bonding pad 220. Then, a metal layer 271 under a conductive bump 270 and the conductive bump 270 are formed in turn on the exposed portion of the circuit trace 250. In the embodiment, the conductive bump 270 can be made of a solder or lead-free material, and the material of the under bump metallurgy layer 271 can be selected according to the material of the conductive bump 270.

Figure 3:
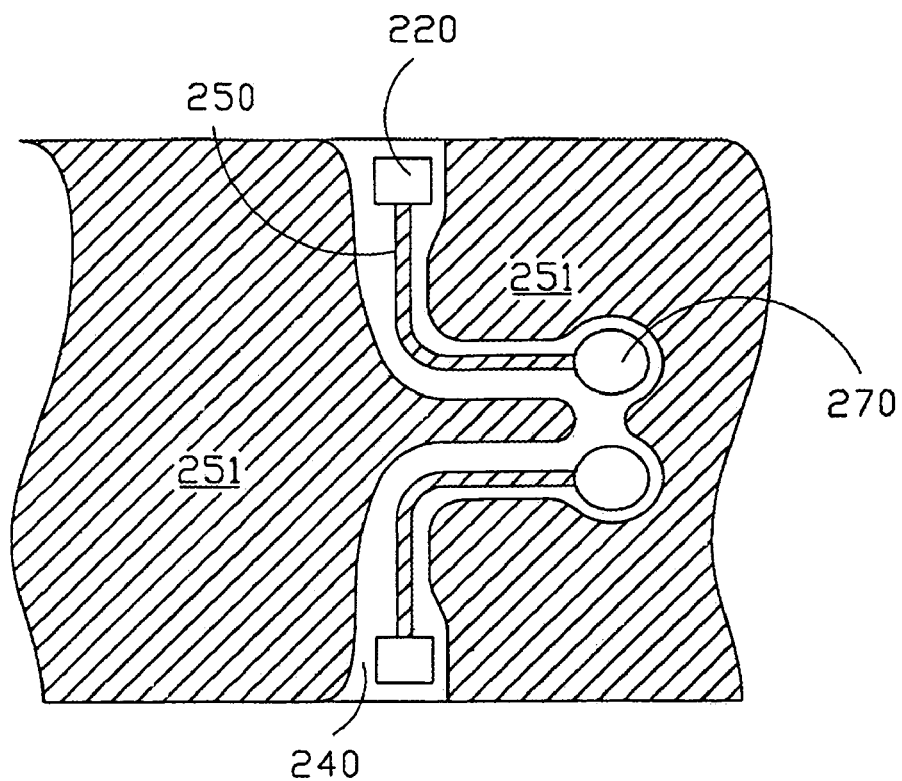
FIG. 3 is a vertical view of one preferred embodiment of the present invention.

FIG. 3 shows a vertical view of the redistribution layer of the present invention. As shown in FIG. 3, the circuit trace 250 and the metal buffering layer 251 are separated by the exposed portion of the dielectric layer 240, therefore, there is no electrical connection between the circuit trace 250 and the metal buffering layer 251. In the other hand, the circuit trace 250 is electrically connected to the bonding pad 220, and a portion of the circuit trace 250 is exposed for contacting and receiving the under bump metallurgy layer and the conductive bump 270. According to the above mentions, the metal buffering layer 251 can be a full-piece metal layer to increase the flatness itself and make the structures under the metal buffering layer 251 get a uniform stress to avoid suffering from a great compressing strength, and preventing the passivation layer 230 from cracking and the circuit trace 250 from collapsing to promote the yield of the packaged wafer.

FIG. 4A to 4E are schematic cross-sectional drawings for the manufacture process of the redistribution layer in one embodiment of the present invention. Referring to the FIG. 4A, a wafer 210 having at least a bonding pad 220 thereon is provided, wherein the bonding pad 220 could be an aluminum or copper pad. Subsequently, a dielectric layer is formed on the wafer 210 and the bonding pad 220 by an appropriate method, such as deposition. Then, referring to FIG. 4B, a portion of the dielectric layer is removed to expose a portion of the bonding pad 220 and a passivation layer 230 is formed on the wafer 210. Furthermore, forming a dielectric layer 240 on the passivation layer 230 and the exposed portion of the bonding pad 220 by an appropriate method, such as a deposition or coating method. After that, a portion of the dielectric layer 240 is removed to expose the portion of the bonding pad 220 exposed by the passivation layer 230.

Figure 4A:
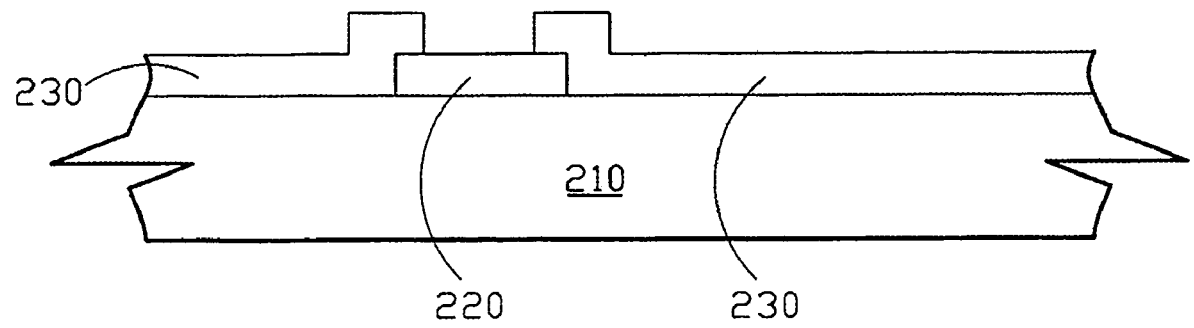
FIG. 4A to 4E are schematic cross-sectional views for manufacturing a redistribution layer of one preferred embodiment of the present invention.
Figure 4B:
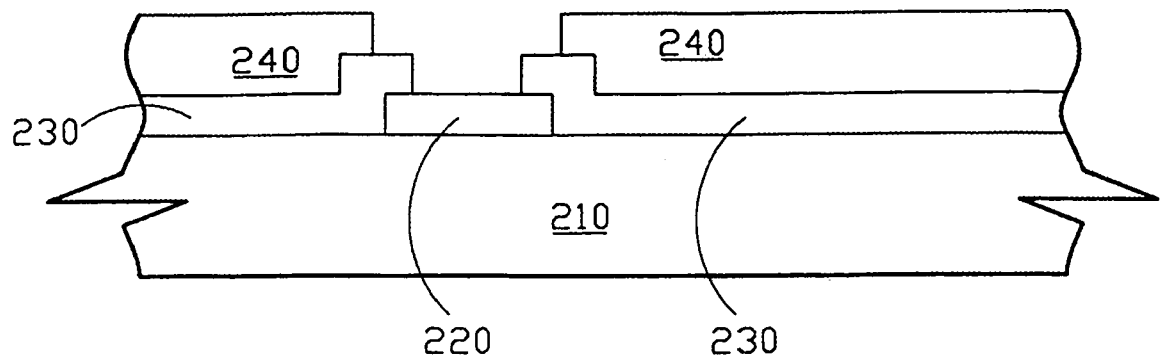
Figure 4C:
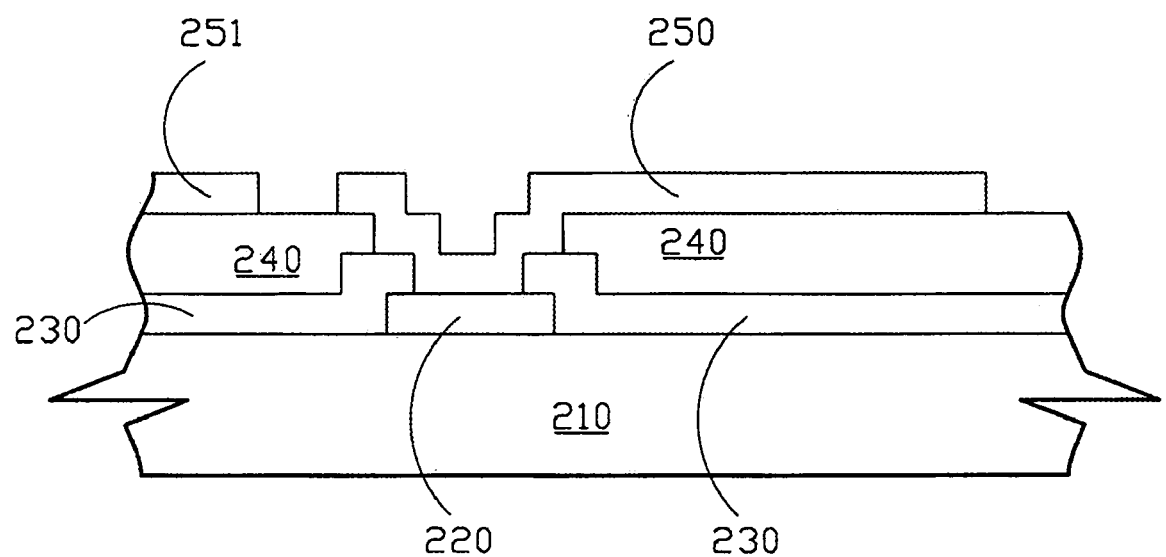
Figure 4D:
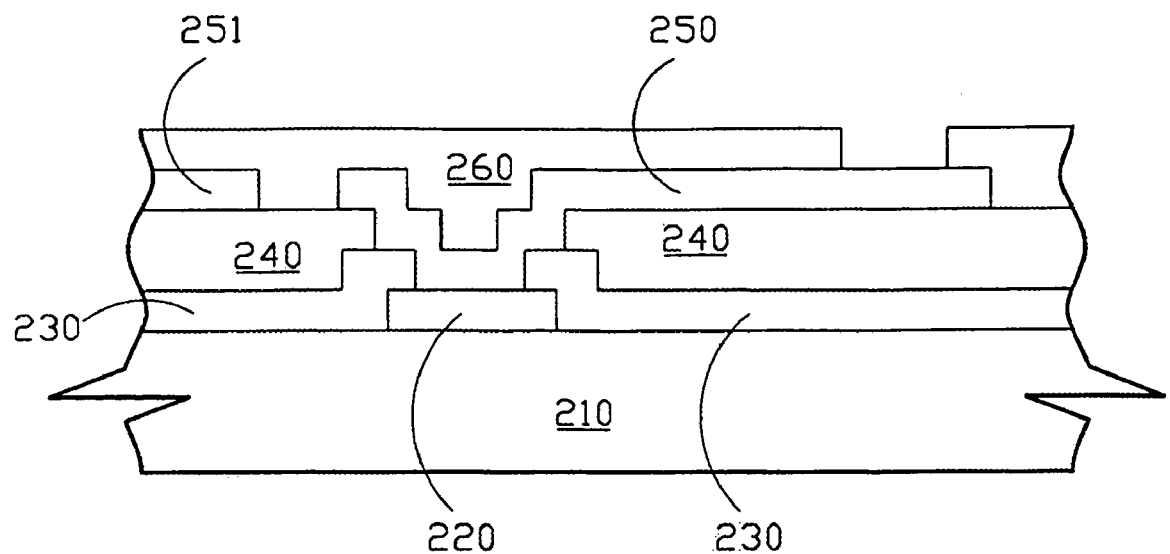
Figure 4E:
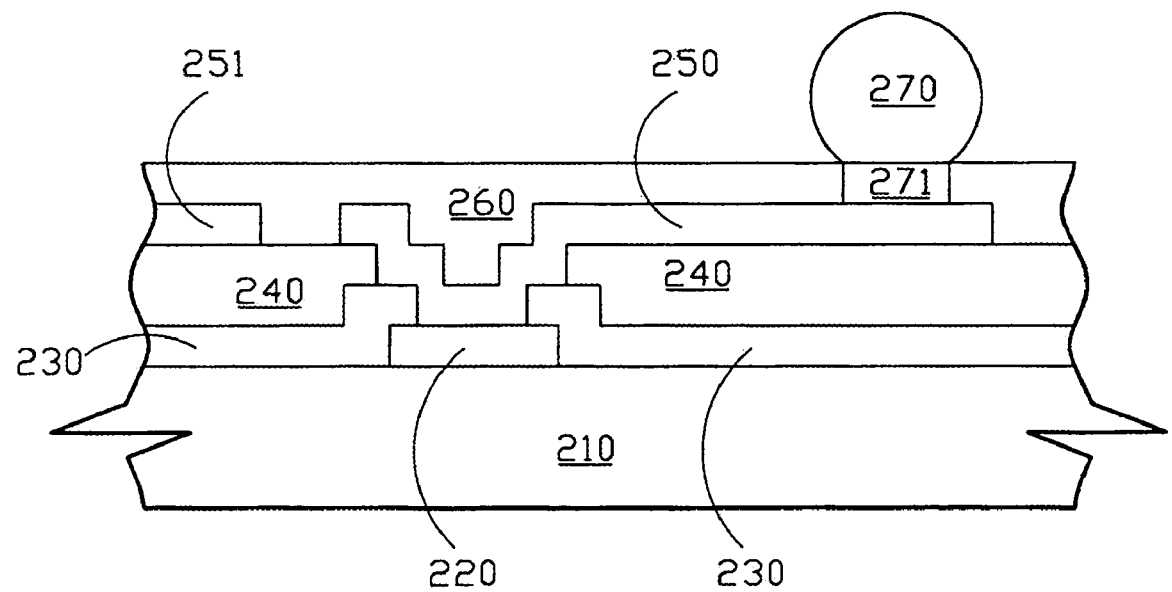

Following, referring to FIG. 4C, with an appropriate method, such as a deposition or sputtering method, a metal layer is formed on the dielectric layer 240 and the bonding pad 220, then applying a mask to reverse a pattern of the redistribution layer on the metal layer. Wherein the pattern of the redistribution layer comprises a first and a second pattern portions, and both pattern portions are divided separately. Then, a circuit trace 250 and a metal buffering layer 251 can be formed in the metal layer by using the pattern of the redistribution layer as a mask to remove a portion of the metal layer to expose a portion of the dielectric layer 240. Subsequently, as shown in FIG. 4D, forming another dielectric layer 260 on the circuit trace 250, the metal buffering layer 251 and the exposed portion of the dielectric layer 240 via an appropriate method, such as a deposition or coasting method. Then, with appropriate method, such as a photolithography process, removing a portion of the dielectric layer 260 and exposing a partial surface of the circuit trace 250, wherein the exposed portion of the circuit trace 250 is in an offset relationship with respect to the aforesaid exposed portion of the bonding pad 220. In another word, the exposed portion of the circuit trace 250 does not completely overlap the exposed portion of the bonding pad 220. Finally, as shown in FIG. 4E, by a general method, the under bump metallurgy layer 271 and the conductive bump 270 are formed in turn on the exposed portion of the circuit trace 250.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A structure of redistributing circuit traces, comprising:
a wafer having a bonding pad thereon;
a passivation layer formed on said wafer, wherein said passivation layer exposes a portion of said bonding pad;
a first dielectric layer formed on said passivation layer exposing said exposed portion of said bonding pad;
a conductive layer comprising a first portion and a second portion, wherein said first portion of said conductive layer is on and contacted said exposed portion of said bonding pad and said first dielectric layer, said second portion of said conductive layer is on and contacted said first dielectric layer, and there is no electrical connection between said first portion and said second portion, and said second portion is a full-piece metal layer and not connected to said bonding pad;
a second dielectric layer formed on said conductive layer exposing a portion of said first portion, wherein said exposed portion of said first portion is in an offset relationship with respect to said exposed portion of said bonding pad; and
a conductive bump formed on said exposed portion of said first portion.

2. The structure of redistributing circuit traces of claim 1 wherein said bonding pad is a metal pad.

3. The structure of redistributing circuit traces of claim 1 wherein said passivation layer is made of a dielectric material.

4. The structure of redistributing circuit traces of claim 1 wherein said first dielectric layer is made of benzocyclobutene.

5. The structure of redistributing circuit traces of claim 1 wherein said conductive layer is a metal layer.

6. The structure of redistributing circuit traces of claim 1 wherein said second dielectric layer is made of benzocyclobutene.

7. The structure of redistributing circuit traces of claim 1 wherein a portion of said exposed portion of said first portion is existed between said first portion and said second portion.

8. The structure of redistributing circuit traces of claim 1 wherein said conductive bump is mainly made of a solder material.

9. The structure of redistributing circuit traces of claim 1 wherein said conductive bump is mainly made of lead-free material.

10. The structure of redistributing circuit traces of claim 1, further comprising an under metallurgy layer formed between said conductive bump and said exposed portion of said first portion.

11. A structure of redistributing circuit traces, comprising:
a wafer having a bonding pad thereon;
a passivation layer formed on said wafer, wherein said passivation exposes a portion of said bonding pad;
a first dielectric layer formed on said passivation layer exposing said exposed portion of said bonding pad;
a conductive layer on and contacted said exposed portion of said bonding pad and said first dielectric layer, wherein said conductive layer comprises a first portion and a second portion, and a portion of said first dielectric layer is exposed between said first and said second portion, and said second portion is a full-piece metal layer and not connected to said bonding pad,
a second dielectric layer formed on said conductive layer and said exposed portion of said first dielectric layer, and exposing a portion of said first portion, wherein said exposed portion of said first portion is in an offset relationship with respect to said exposed portion of said bonding pad; and
a conductive bump formed on said exposed portion of said first portion.

12. The structure of redistributing circuit traces of claim 11, further comprising an under metallurgy layer formed between said conductive bump and said exposed portion of said first portion.

13. The structure of redistributing circuit traces of claim 11 wherein said exposed portion of said bonding pad is electrically connected to said conductive bump through said first portion.

* * * * *